United States Patent [19]
Johnson

[11] Patent Number: 5,253,267
[45] Date of Patent: Oct. 12, 1993

[54] LASER MULTIPLE FEEDBACK CONTROL CIRCUIT AND METHOD

[75] Inventor: Keith Johnson, Orland Park, Ill.

[73] Assignee: Amoco Corporation, Chicago, Ill.

[21] Appl. No.: 909,164

[22] Filed: Jul. 6, 1992

Related U.S. Application Data

[63] Continuation-in-part of Ser. No. 708,501, May 31, 1991, Pat. No. 5,177,755.

[51] Int. Cl.[5] .............................................. H01S 3/00
[52] U.S. Cl. ........................................ 372/38; 372/31; 372/29
[58] Field of Search ....................... 372/38, 29, 31, 32, 372/30, 69, 70

[56] References Cited

U.S. PATENT DOCUMENTS

| | | | |
|---|---|---|---|
| 4,672,192 | 6/1987 | Muka et al. | 372/29 |
| 4,847,477 | 7/1989 | Smith | 372/29 |
| 5,177,755 | 1/1993 | Johnson | 372/38 |

OTHER PUBLICATIONS

Thomas J. Kane, "Intensity Noise in Diode-Pumped Single-Frequency Nd:YAG Lasers and its Control by Electronic Feedback", *Photonics Technology Letters*, vol. 2, No. 4, Apr. 1990.

*Primary Examiner*—Léon Scott, Jr.
*Attorney, Agent, or Firm*—Stephen G. Mican; Thomas W. Tolpin

[57] ABSTRACT

A method and apparatus for reducing the effects of relative intensity noise in a diode laser system by sensing the light output of diode laser system and producing an electrical feedback signal; amplifying the feedback signal over at least two different parts of a frequency band that includes the Relaxation Oscillation Frequency of the laser system; shifting the phase of each of the amplified feedback signals over the frequency band; and superimposing onto the current supplied to the laser diode a current signal that is a function of each of the phase shifted and amplified feedback signals.

20 Claims, 3 Drawing Sheets

LASER MULTIPLE FEEDBACK CONTROL CIRCUIT AND METHOD

RELATIONSHIP TO OTHER APPLICATIONS

This patent application is a continuation-in-part of my U.S. patent application filed on May 31, 1991 under Ser. No. 708,501 now U.S. Pat. No. 5,177,755, Jul. 13, 1992.

TECHNICAL FIELD

This invention relates to the general subject of lasers and, more specifically, to a circuit and method for improving the performance of solid-state, diode-pumped lasers.

BACKGROUND OF THE INVENTION

One important use of lasers is in communications and information transfer, wherein one or more lasers transmit modulated light signals through one end of an optical fiber or cable. A receiver at the opposite end of the cable then converts the laser light into useful information. Laser intensity noise is one of the limiting factors in the transmission of analog or digital signals. Laser intensity noise reduces the ratio of signal-to-noise and increases bit error rates.

Relative intensity noise (RIN), describes the dynamic range of either the laser or the associated fiberoptic communications system. RIN can be thought of as a kind of inverse carrier-to-noise measurement, or as a measure of the spectral distribution of the noise content. More specifically RIN is defined as the ratio of the means square optical intensity noise to the square of the average optical power. Total system noise is the combination of laser intensity noise, thermal noise from the electronics and noise, thermal noise from the electronics and photonic shot noise. RIN is usually expressed in db per Hz of bandwidth.

Semiconductor laser sources, such as laser diodes and laser diode arrays, can be used alone or they can be used to pump another laser or laser system, such as a laser using Nd:YAG (i.e., neodymium doped yttrium aluminum garnet) as the lasant material. However used, a laser diode is activated or driven to produce laser light in response to the flow of DC electrical current from a power supply. When the RIN of the output of a diode laser system or a diode-pumped solid-state laser is observed, it is characterized by distinct or dominant peak or a spectral region of high RIN. This peak is the result of the phenomenon of relaxation oscillation. A. E. Siegman, Lasers, University Science Books, Mill Valley, Calif.; Chapter 25, 1986. Relaxation oscillations are small amplitude, quasi-sinusoidal exponentially damped oscillations. For diode pumped solid-state lasers (e.g., Nd:YAG), the spectral region or frequency band is typically between 10 KHz and 10 MHz. Relaxation oscillation is thought to be dependent on the fluorescence lifetime of the lasant material, cavity lifetime of the laser system, and cavity losses.

One means of reducing RIN in a diode-pumped solid-state laser is to use electronic feedback. Kane, "Intensity Noise in Diode-Pumped Single-Frequency Nd:YAG Lasers and its Control by Electric Feedback", *IEEE Photonics Technology Letters*, Vol 2, No. 4, April 1990. In particular, a photo-diode was used to sense the output of the laser system, and an amplifier was used to convert the output of the photo-diode into a phase shifted feedback signal which is added to the output of the DC Power Supply which is used to drive the system's laser diode. A positive phase shift, applied at all frequencies from the relaxation oscillation frequency up to the frequency where loop gain goes below unity, was needed to avoid instability. This phase lead was accomplished by designing the amplifier so that gain is rising as a function of frequency, as is the case of a differentiator.

The Kane feedback circuit does not take in consideration changes in the performance of the laser diode over the life of the laser diode. The relaxation oscillation frequency of a laser system changes over its life. Moreover, there is no teaching or suggestion as to how feedback could be used to cover a broad range of frequencies or how feedback could be tailored to the spectrum of the relative intensity noise. Thus, there is much room for improvement.

SUMMARY OF THE INVENTION

One object of the present invention is to provide an improved feedback circuit for a laser system wherein a laser diode is used as a source of laser light.

A general object of this invention is to minimize Relative Intensity Noise generated in a laser system employing a laser diode or laser semiconductor driven or activated by electrical current to produce laser light.

Another object of the invention is to provide an electronic control circuit and method for reducing Relative Intensity Noise and its effects in a laser system using a laser diode to produce optical pumping.

Still another object is to provide a circuit which uses a photo-diode to provide a feedback signal which is representative of the high and low frequency noise in the output of an optically-pumped solid-state laser, wherein a laser diode is used to provide optically pumped radiation.

Yet another object of the present invention is to provide a circuit to reduce the effects of Relaxation Oscillation Noise and laser diode aging in a laser system, wherein optical radiation is produced in response to a laser diode.

In accordance with the present invention disclosure is made of a method and apparatus for automatically reducing intensity noise in the output of a diode laser system comprising the steps of: sensing the output of a diode laser system and producing an electrical feedback signal; amplifying said feedback signal over at least two different parts of a frequency band that includes the Relaxation Oscillation Frequency of said laser system; shifting the phase of each of said amplified feedback signals over said frequency band; and superimposing onto the current supplied to said diode laser a current signal that is a function of each of said phase shifted amplified feedback signals.

In one particular embodiment, a feedback circuit is provided for a laser system that, in response to a flow of electrical current through a laser diode, produces a laser light output that is characterized by intensity noise. In one embodiment, the feedback circuit comprises: conversion means, using the laser light output of a laser system that produces light in response to the flow of current through a laser diode, for producing an electrical input signal that is representative of the intensity noise in the laser light output; first feedback means for using said electrical input signal and producing a first feedback signal, said first feedback means having a gain curve that has a first maximum located intermediate the ends of a predetermined frequency band, said predetermined frequency band including that portion of said intensity noise due to the relaxation oscillation frequency of the laser diode; second feedback means for using said electrical input signal and producing a second feedback signal, said second feedback means having a gain curve that has a second maximum located intermediate the ends of said predetermined frequency band and that is separated from said first maximum of said first feedback means; and output means, using said first feedback signal and said second feedback signal, for producing a current gain signal and superimposing said current gain signal on the electrical current flowing through the laser diode to reduce intensity noise generally due to said relaxation oscillation of said laser diode.

By using a plurality of feedback amplifiers which are in parallel with eachother, one can tailor the feedback to reduce relative intensity noise more uniformly across the frequency band of interest. Numerous other advantages and features of the present invention will become readily apparent from the following detailed description of the invention, the embodiment described therein, the claims, and from the accompanying drawings.

BRIEF DESCRIPTION OF THE INVENTION

DESCRIPTION OF A PREFERRED EMBODIMENT

Figure 1:
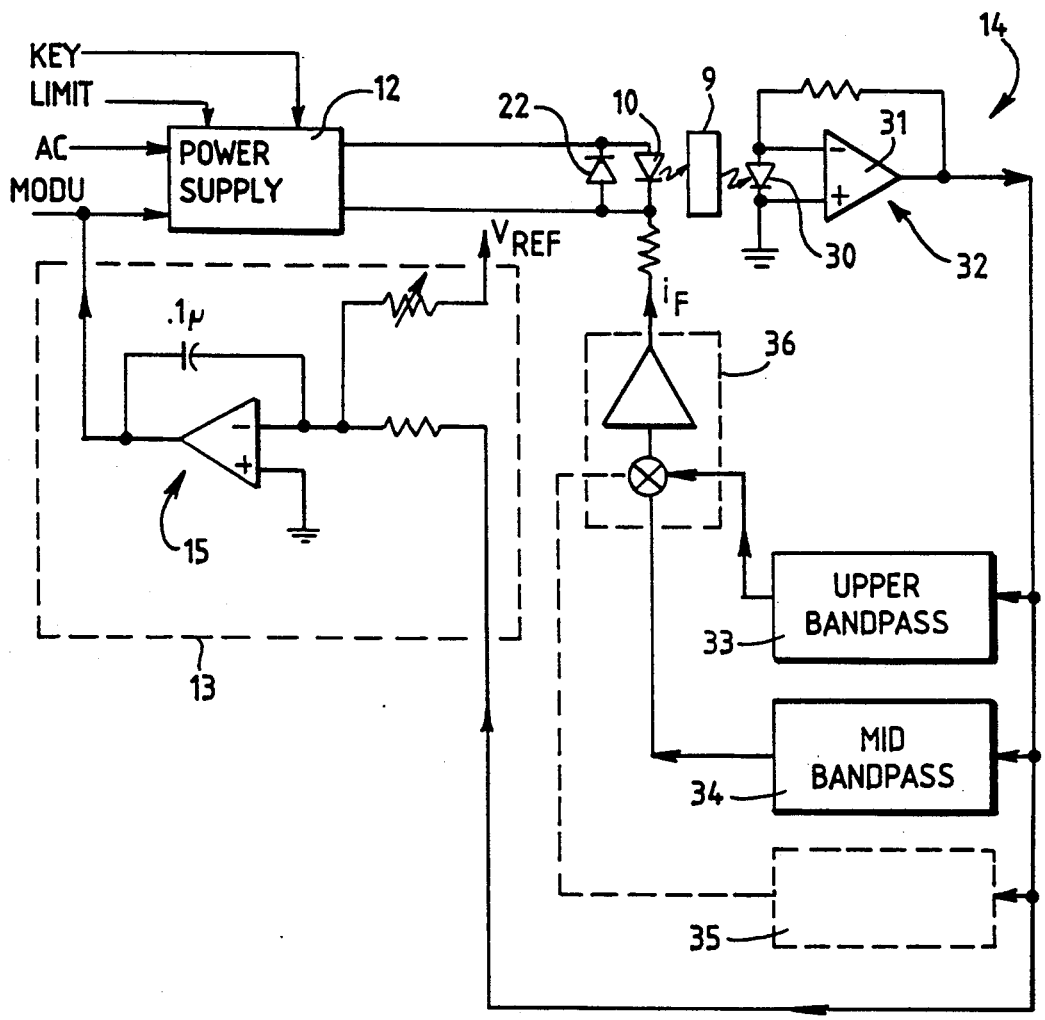
FIG. 1 is a block diagram of the feedback circuit of the present invention.

While this invention is susceptible of embodiment in many different forms, there is shown in the drawings and will herein be described in detail one specific embodiment of the invention. It should be understood, however, that the present disclosure is to be considered an exemplification of the principles of the invention and is not intended to limit the invention to specific embodiments illustrated.

Turning to FIG. 1, there is illustrated: a laser system which produces a laser light output in response to the flow of electrical current through a semi-conductor component 10, such as a laser diode or laser diode array; a solid-state laser 9 which is pumped by the light from the semi-conductor component; a Power Supply or driver circuit 12 for the semi-conductor component; a Constant Power Circuit 13 and an Automatic Relaxation Oscillation Noise Reduction Circuit 14 that is the focus of the present invention.

Suitable semi-conductor components 10 include, but are not limited to, laser diodes, light-emitting diodes (including superluminescent diodes and superluminescent diode arrays) and laser diode arrays, together with any ancillary packaging or structures. For example, such devices are commonly attached to a heat resistant and conductive heat sink and are packaged in a metal housing.

For efficient operation, the pumping radiation emitted by the simi-conductor component 10 is desirably matched with a suitable absorption band of a lasant material 9. Although the invention is not to be so limited, a highly suitable optical pumping source 10 consists of a gallium aluminum arsenide laser diode, which emits light having a wavelength of about 810 nm, that is attached to heat sink. The heat sink can be passive in character. However, heat sink can also compromise a thermoelectric cooler or other temperature regulation means to help maintain the semi-conductor component 10 at a constant wavelength.

Without loss of generality the discussion which follows will concern itself with a semi-conductor component 10 in the form of a laser idode or laser diode array. Those skilled in the art know that when a laser diode or diode array is placed in operation, it is characterized by relaxation oscillations. Relaxation oscillations give rise to amplitude or intensity noise. Although the following discussion makes reference to a laser diode or laser diode array, it should be understood that the present invention is directed to any semi-conductor source which exhibits relaxation oscillation or its equivalent.

The basic Power Supply 12 has a safety key, has an AC line input, and operates within present limits and/or under a modulation control signal. Protection against reverse bias is provided by an opposing diode 22 in parallel with a semi-conductor source 10 in the form of a laser diode. Power supplies or driver circuits 12 for laser diodes 10 are well known to those skilled in the art (e.g., see U.S. Pat. No. 4,809,286 to Kollanyi et al. and R. Quenelle, "Diode-laser drivers address special requirements," *Laser Focus World*, p. 129, January 1991) and need not be discussed in greater detail.

The Automatic Relaxation Oscillation Noise Reduction Circuit 14 comprises: a photo-diode 30 which receives laser light from the laser diode 10 (or through a solid-state laser 9 pumped by the laser diode); Amplifying Means 32 for the signal from the photo-diode; a plurality of bandpass amplifiers 33, 34 and 35 and a Summing Amplifier 36.

The Amplifying Means 32 serves to convert the current flowing through the photo-diode into a voltage. As such, it performs as an op-amp I to V converter. The Amplifying Means 32 comprises an operational amplifier 31 whose inputs are connected across the photo-diode 30, and a feedback resistor. The output of the Amplifying Means 32 is sent to each bandpass amplifier 33, 34 and 35 and to the Constant Power Circuit 13.

Figure 2:
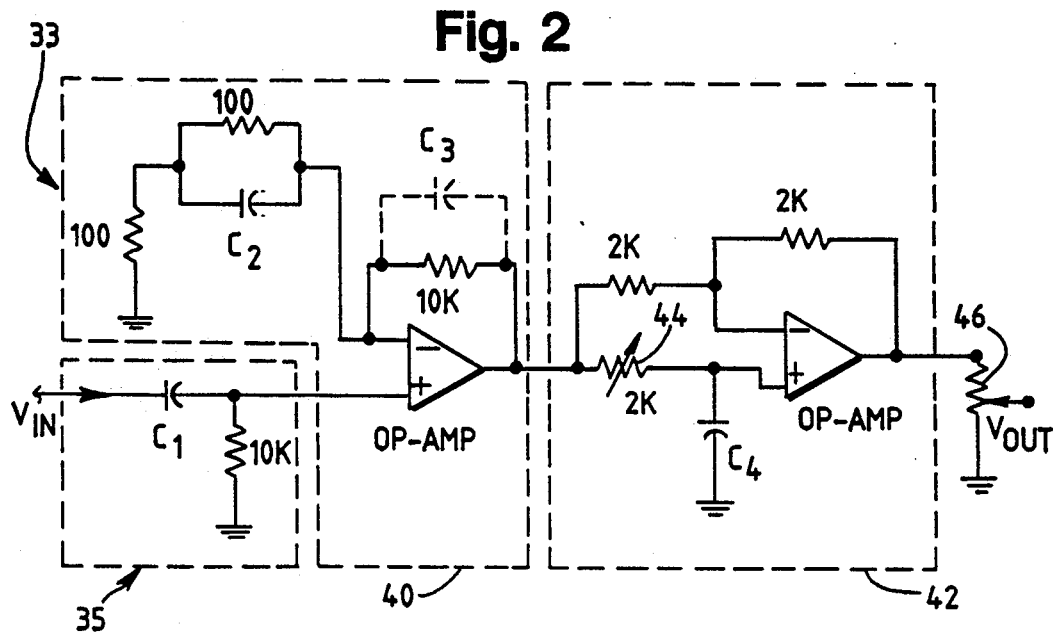
FIG. 2 is an electrical schematic diagram of the bandpass amplifiers shown in FIG. 1.

FIG. 2 illustrates a typical bandpass amplifier 33. The output from the Amplifying Means 32 is sent through a high pass RC filter 37 to a frequency dependent (i.e., band width limiting) operational amplifier circuit 40. The frequency dependent amplifying circuit 40 operates to amplify higher frequency signals in preference to lower frequency signals. The circuit response and gain are set to limit oscillation in the laser system. Depending on the component values of the resistors and capacitors forming each bandpass amplifier, the performance can be characterized as an upper bandpass amplifier 33 (See FIG. 3D), a mid bandpass amplifier 34 (See FIG. 3C) or, if more than two amplifiers are used, a low bandpass amplifier 35 (See FIG. 3B). For example, in one embodiment of the invention comprising only two bandpass amplifiers, the following capacitor components were used (all are expressed in $\mu f$):

|  | $BP_1$ | $BP_2$ |
| --- | --- | --- |
| $C_1$ | .1 | .001 |
| $C_2$ | .1 | .01 |
| $C_3$ | .001 | NOT USED |

-continued

| | BP₁ | BP₂ |
|---|---|---|
| C₄ | .1 | .001 |

Peaking capacitor $C_3$, if used, limits the band width to lower frequencies and tends to prevent the masking of voltage offset due to circuit noise. Other component values are shown in the drawings.

The output of the amplifying circuit 40 is passed to a Phase Shifting Means 42. The Phase Shifting Means 42 takes the signal from the amplifying circuit 40 and introduces a frequency dependent phase shift which increases from 0 to $-180°$ as the frequency of the signal from the amplifying circuit increases. Preferably, the phase shift is relatively constant (e.g., unity gain) over a predetermined frequency band. Here the Phase Shifting Means 42 functions much as a First-Order All-Pass Filter.

Figure 3A:
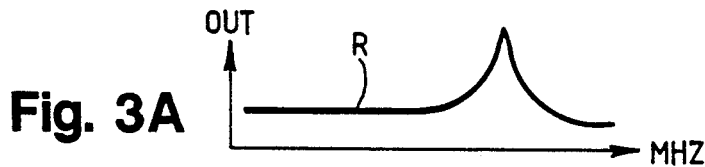
FIGS. 3A through 3F are graphical representations of Relative Intensity Noise, the response of the bandpass amplifiers and their effect on Relative Intensity Noise.
Figure 3B:
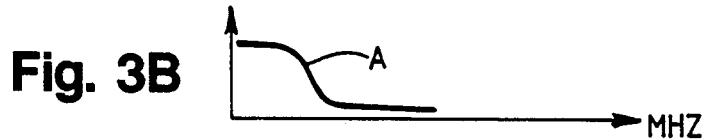
Figure 3C:
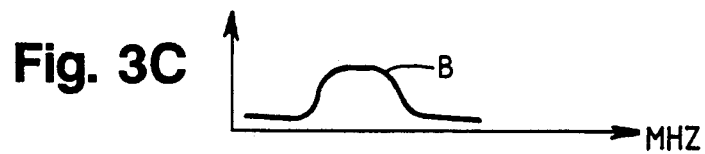
Figure 3D:
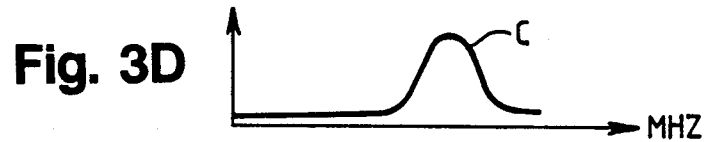
Figure 3E:
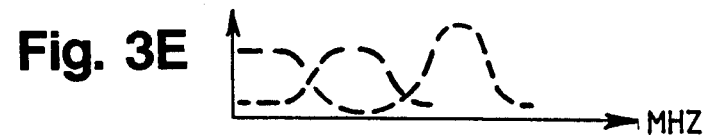
Figure 3F:
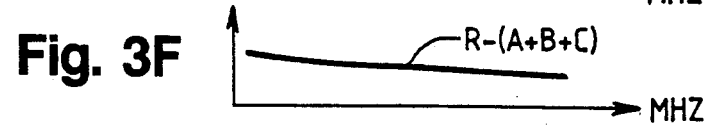
Figure 4:
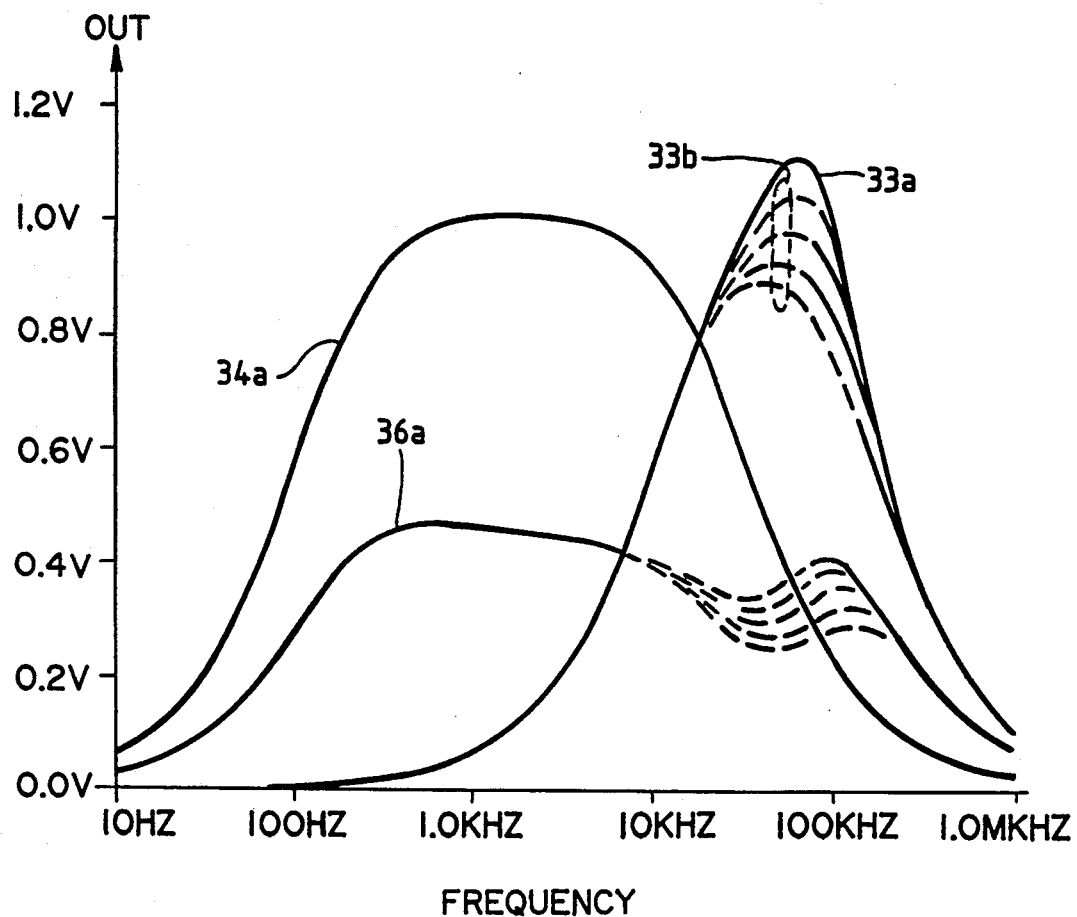
FIG. 4 illustrates the performance of part of the feedback circuit of FIG. 1.

FIG. 4 illustrates the effect of combining the outputs of the upper 33 and mid 34 bandpass amplifiers. More specifically there is illustrated the frequency response 34a of the mid bandpass amplifier 34 and the frequency response 33a of the upper bandpass amplifier 33. The effect of varying the phase adjustment pot 44 is shown by means of broken lines 33b. The amplitude of the signal out of the phase shifting means 42 can be controlled by means of an output or signal weighing pot 46. Thus the summing amplifier 36 produces an output characteristic 36a which is a weighted or scaled combination of the two bandpass amplifiers 33 and 34. In otherwords, the phase adjustment pots 44 and the weighing pots 46 allow one to tailor the composite output to compensate for the effect of RIN (i.e., FIG. 3A and FIG. 3F).

The outputs from each bandpass amplifier are combined (See FIG. 3E) by means of a Summing Amplifier 36. An output current signal is superimposed on the current flowing from the Power Supply 12 to drive the laser diode 10. Because the phase of the output of a Phase Shifting Means 42 becomes increasingly negative as the frequency of the signal out of the photo-diode 30 increases, a negative feedback current signal $i_F$ is superimposed on the laser diode 10.

FIG. 3A shows the RIN which would appear at the output of a photo-diode detector in the absence of the Automatic Relaxation Oscillation Noise Reduction Circuit that is the subject of the present invention. Preferably, the feedback current $i_F$ is sufficient to substantially reduce the amplitude noise which is in the laser system output and which is due to the relaxation oscillation frequency of the laser diode 10. FIG. 3F shows the RIN when the Automatic Relaxation Oscillation Noise Reduction Circuit 14 is used.

The Constant Power Circuit 13 comprises an integrator 15 which combines a reference signal $V_{REF}$ and the output of the Amplifying Means 32. As the laser diode 10 ages, its output tends to decrease. The integrator 15 senses this decrease in power output and provides a feedback signal to the power supply 12 to maintain the power output of the laser diode fairly constant.

From the foregoing description, it will be observed that numerous variations, alternatives and modifications will be apparent to those skilled in the art. Accordingly, this description is to be construed as illustrative only and is for the purpose of teaching those skilled in the art the manner of carrying out the invention. Various changes may be made, components substituted and features of the invention may be utilized. For example, although FIG. 1 shows three bandpass amplifiers in parallel with eachother, it may be advantageous to place the upper bandpass amplifier in series with a lower bandpass amplifier and mid bandpass amplifier which are in parallel with each other. This arrangement may facilitate setting the phase adjustment pots to reduce RIN. Thus, it will be appreciated that various modifications, alternatives, variations, etc., may be made without departing from the spirit and scope of the invention as defined in the appended claims. It is, of course, intended to cover by the appended claims all such modifications involved within the scope of the claims.

I claim:

1. In a laser system that, in response to a flow of electrical current through a laser diode, produces a laser light output which is characterized by intensity noise that is a function of frequency, a feedback circuit comprising:
    a) conversion means, using the laser light output of a laser system that produces light in response to the flow of current through a laser diode, for producing an electrical input signal that is representative of the intensity noise in the laser light output;
    b) first feedback means for using said electrical input signal and producing a first feedback signal, said first feedback means having a gain curve that has a first maximum located intermediate the ends of a predetermined frequency band, said predetermined frequency band including that portion of said intensity noise due to the relaxation oscillation frequency of the laser diode;
    c) second feedback means for using said electrical input signal and producing a second feedback signal, said second feedback means having a gain curve that has a second maximum located intermediate the ends of said predetermined frequency band and that is separated from said first maximum of said first feedback means; and
    d) output means, using said first feedback signal and said second feedback signal, for producing a current gain signal and superimposing said current gain signal on the electrical current flowing through the laser diode to reduce intensity noise generally due to said relaxation oscillation of said laser diode.

2. The circuit of claim 1, wherein said first feedback means includes first phase shifting means for applying a phase shift to said first feedback signal over at least part of said predetermined frequency band; and wherein said second feedback means includes second phase shifting means for applying a phase shift to said second feedback signal over at least part of said predetermined frequency band.

3. The circuit of claim 2, wherein at least one of said phase shifting means is characterized by unity gain and phase shift that increases in the range from about 0 degrees to about $-180$ degrees as the frequency of said feedback signal increases across said frequency band.

4. The circuit of claim 1, further including:
    e) third feedback means for using said electrical input signal and producing a third feedback signal, said third feedback means having a gain curve that has a third maximum located at the low frequency end of said predetermined frequency band, said predetermined frequency band including that portion of said amplitude noise due to long term changes in the amplitude of said laser light output.

5. The circuit of claim 1, wherein the diode laser pumps a solid state laser that produces said laser light output.

6. The circuit of claim 1, wherein said conversion means comprises a photo-diode that is positioned to receive at least a portion of said laser light output and that is operatively connected to an amplifier to produce said electrical input signal.

7. The circuit of claim 1, wherein at least one of said feedback means comprises: an R-C filter for receiving said electrical input signal; and an operational amplifier circuit for receiving an output of said R-C filter.

8. A laser system, comprising:
a) a semi-conductor light source characterized by a relaxation oscillation frequency;
b) supply means for supplying current to said semi-conductor light source to produce laser light that is characterized by noise that is a function of the said relaxation oscillation frequency;
c) photo-diode means, that is responsive to said laser light, for producing an input signal that is a function of said noise;
d) means for producing a plurality of phase shifted feedback signals from said input signal, each of said phase shifted feedback signals being characterized by a gain curve having a maximum located intermediate the ends of a predetermined frequency band and separated from at least one adjacent maximum, said predetermined frequency band including that portion of said amplitude noise due to the relaxation oscillation frequency of the laser diode; and
e) output means for applying to said supply means a negative feedback output current signal that has a value that is a function of said phase shifted feedback signals and that has the effect of reducing said noise.

9. The laser system of claim 8, further including:
f) means, responsive to said input signal and a reference signal, for producing another feedback signal that is representative of long term amplitude changes of said laser light and applying said another feedback signal to said supply means to control the amplitude of said laser light.

10. The laser system of claim 8, wherein said means for producing a plurality of phase shifted feedback signals comprises:
an operational amplifier that has an output, an inverting input, a non-inverting input and a resistor for joining said output to said inverting input;
means for capacitively connecting an incoming signal to said non-inverting input;
resistance means for connecting said non-inverting input to a ground reference; and
a series parallel circuit comprising two resistors in series with each other for connecting said inverting input to said ground reference and comprising capacitor means for connecting said inverting input to said ground reference through one of said two resistors.

11. The laser system of claim 8, wherein said means for producing a plurality of phase shifted feedback signals comprises:
an operational amplifier that has an output, an inverting input, a non-inverting input and a resistor for joining said output to said inverting input;
means for connecting an incoming signal to said inverting input through a resistance;
means for connecting said incoming signal to said non-inverting input through resistance means; and
capacitor means for connecting said non-inverting input to a ground reference.

12. An automatic noise reduction circuit for a laser system whose laser light output is characterized by noise and is a function of the flow of electrical current through a semi-conductor component, comprising:
a) conversion means, responsive to laser light produced in response to the flow of electrical current through a semi-conductor component, for producing an output electrical control signal;
b) upper bandpass means for receiving said control signal and producing a first electrical feedback signal, said upper bandpass means having a maximum frequency response at a high end of a predetermined frequency band;
c) middle bandpass means for receiving said control signal and producing a second electrical feedback signal, said middle bandpass means having a maximum frequency response at a location intermediate the ends of said predetermined frequency band;
d) lower bandpass means for receiving said control signal and producing a third electrical feedback signal, said lower bandpass means having a maximum frequency response at a low end of said predetermined frequency band;
e) means, using said first feedback signal and said second feedback signal and said third feedback signal, for changing said electrical current flowing through said laser diode means to reduce the noise in said light.

13. The circuit of claim 12, wherein said conversion means comprises:
aa) first operational amplifier means having an output, an inverting input and a non-inverting input that is connected to a ground reference.
ab) first resistor means for connecting said inverting input to said output; and
ac) a photo-diode that is located to receive said light and that connects said non-inverting input to said ground reference.

14. The circuit of claim 12, wherein said upper bandpass means and said lower bandpass means are electrically connected in parallel with each other.

15. The circuit of claim 12, wherein at least one of said upper bandpass means, said middle bandpass means and said lower bandpass means comprises:
amplifier means having an output, an inverting input that is joined to its output by a feedback resistor and a non-inverting input that is connected to a ground reference by a resistor and that is connected to said output of said conversion means by a capacitor; and
a series parallel circuit comprising two resistors in series with each other for connecting said inverting input of said amplifier means to said ground reference and comprising capacitor means for connecting said inverting input of said amplifier means to said ground reference through one of said two resistors in series with each other.

16. The circuit of claim 15, further including a peaking capacitor in parallel with said feedback resistor.

17. The circuit of claim 15, wherein said at least one of said upper bandpass means, said middle bandpass means and said lower bandpass means further comprises means for shifting the phase of said output of said amplifier means.

18. The circuit of claim 17, wherein said means for shifting the phase of said output of said amplifier means comprises: operational amplifier means having an output, having an inverting input that is connected to its output through one resistance and by another resistance to said output of said amplifier means, and having a non-inverting input that is connected to said output of said amplifier means by resistance means and that is connected to said ground reference by capacitor means.

19. A method of automatically reducing intensity noise in the output of a diode laser system, comprising the steps of:
   a) sensing the output of a diode laser system and producing an electrical feedback signal;
   b) amplifying said feedback signal over at least two different parts of a frequency band that includes the Relaxation Oscillation Frequency of said laser system;
   c) shifting the phase of each of said amplified feedback signals over said frequency band; and
   d) superimposing onto the current supplied to said diode laser a current signal that is a function of each of said phase shifted amplified feedback signals.

20. The method of claim 19, further including the steps of:
   e) producing a reference signal;
   f) producing a current control signal that is a function of the difference between said reference signal and said electrical feedback signal; and
   g) using said control signal to change the current applied to the laser diode of said diode laser system.

* * * * *